United States Patent [19]
Lim

[11] Patent Number: 6,028,814
[45] Date of Patent: Feb. 22, 2000

[54] GUARANTEED DYNAMIC PULSE GENERATOR

[75] Inventor: Steve W. Lim, Cupertino, Calif.

[73] Assignee: Integrated Silicon Solution, Inc., Santa Clara, Calif.

[21] Appl. No.: 09/003,773

[22] Filed: Jan. 7, 1998

[51] Int. Cl.[7] .................................................. G11C 8/00
[52] U.S. Cl. ...................... 365/230.06; 327/200; 327/208
[58] Field of Search .................................. 327/200, 208, 327/210, 217, 225; 365/233, 230.06, 230.08, 189.05

[56] References Cited

U.S. PATENT DOCUMENTS

| | | | |
|---|---|---|---|
| 5,304,951 | 4/1994 | Cosand | 331/1 A |
| 5,374,894 | 12/1994 | Fong | 327/14 |
| 5,633,607 | 5/1997 | Millar | 327/217 |
| 5,798,730 | 8/1998 | Sanchez | 342/195 |

OTHER PUBLICATIONS

Hitachi, "HM5216326 Series Block Diagram," (Undated), one sheet.
Samsung Electronics, "KM4132G271 Graphic Memory," (1996), p. 1.
NEC Block Diagram, "μPD48150," (undated), 1 sheet.

*Primary Examiner*—David Nelms
*Assistant Examiner*—Hien Nguyen
*Attorney, Agent, or Firm*—Pennie & Edmonds LLP

[57] ABSTRACT

The present invention is dynamic pulse generator for generating an output pulse from a first input pulse and a second input pulse, where the output pulse is guaranteed to have a pulse width of at least the pulse width of whichever of the two input pulses has a delayed leading edge with respect to the other. The first input pulse has a first leading edge and a first trailing edge. The second input pulse has a second leading edge and a second trailing edge. The second leading edge is delayed from the first leading edge. An edge detector detects the second leading edge, and outputs a first predetermined level when the second leading edge is detected. The edge detector also detects the first trailing edge and the second trailing edge and outputs a second predetermined level. A latch is responsive to the edge detector and generates a signal indicating that the second leading edge has been detected. The latch maintains the output of the edge detector at the first predetermined level until the edge detector detects both the first trailing edge and the second trailing edge.

16 Claims, 10 Drawing Sheets

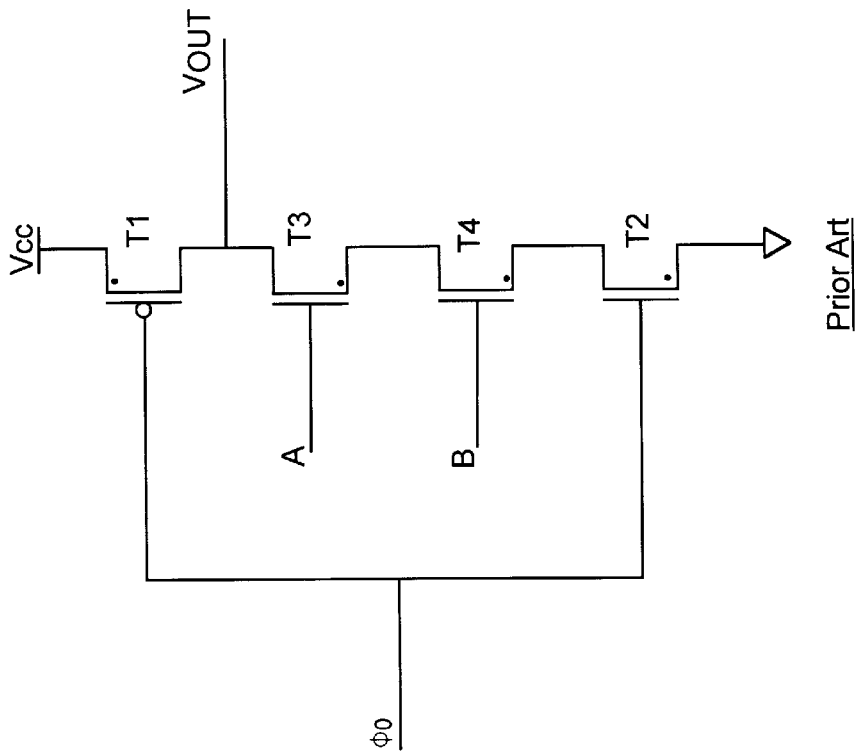
FIG. 1c Prior Art
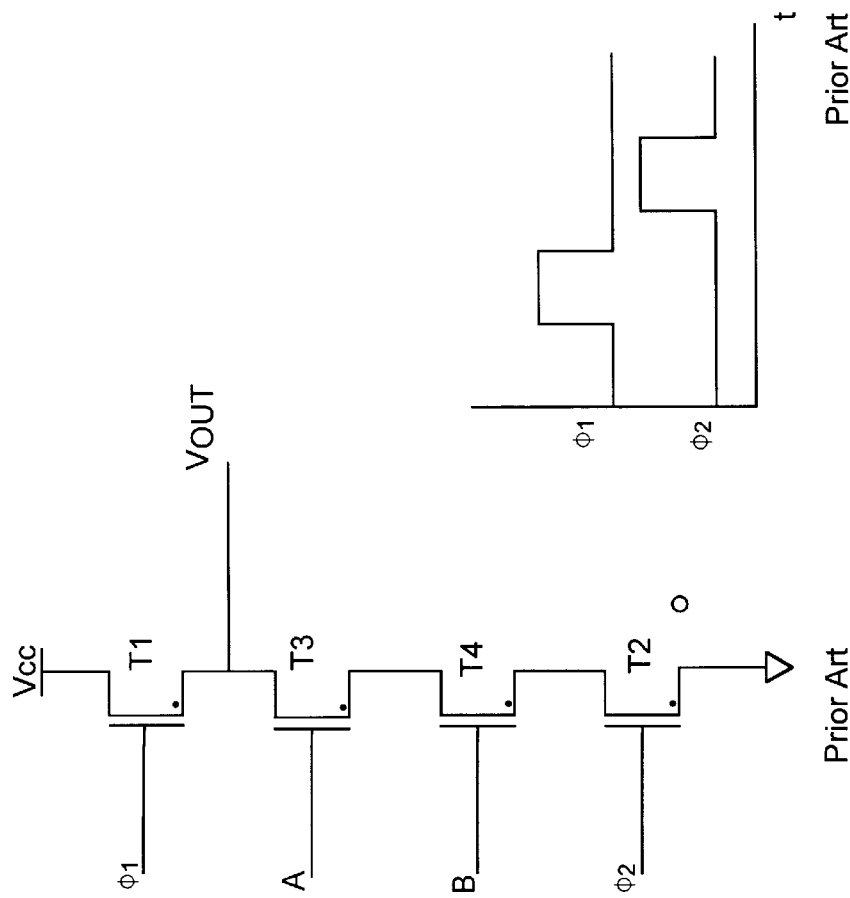
FIG. 1b Prior Art
FIG. 1a Prior Art

GUARANTEED DYNAMIC PULSE GENERATOR

The present invention relates generally to a dynamic pulse generator for an integrated circuit, and particularly to a pulse generator which guarantees that a dynamic pulse will be generated.

BACKGROUND OF THE INVENTION

Metal-oxide-semiconductor (MOS) circuits have two classes of logic families: static and dynamic. Static and dynamic logic families operate differently. Static logic comprises a load device and a driver which performs a logic function. Typically, in PMOS or NMOS technology, the load device is a constant current source which is always turned on in one logic state and therefore dissipates power. CMOS technology reduces, but does not eliminate, the amount of power dissipated.

Dynamic logic comprises precharge circuitry and circuitry which performs a logic function. Typically, dynamic logic is used in MOS circuits for low-power synchronous applications.

FIG. 1a is a schematic of an exemplary NMOS dynamic circuit. In this and the following schematics, the following conventions are used. A dot, i.e., "•", inside the transistor is placed closest to the transistor's source. A p-channel transistor has an "o" on its gate, while an n-channel transistor has no "o." If a substrate wire is not shown, for an n-channel transistor the substrate connects to ground, and for a p-channel transistor, the substrate connects to the power supply voltage Vcc. NMOS circuits use n-channel transistors and PMOS circuits use p-channel transistors. CMOS circuits use both n-channel and p-channel transistors.

FIG. 1b is a timing diagram of the clock pulses input to the exemplary circuit of FIG. 1a. This NMOS dynamic circuit uses clocked logic having two phases, $\phi_1$ and $\phi_2$. The clock signals $\phi_1$ and $\phi_2$ are input to the gates of transistors T1 and T2, respectively. Logic signals A and B are input to the gates of transistors T3 and T4, respectively. The logic circuit shown in FIG. 1a functions as a NAND gate. Its output signal, i.e., Vout, is equal to Not(A·B). One phase $\phi_1$ of the clock signals turns on the active load T1 and precharges the output node $V_{OUT}$ to a "high" voltage (e.g., Vcc–Vth, where Vth is the threshold voltage of transistor T1). The second phase $\phi_2$ of the clock signals discharges the output node $V_{OUT}$ if the input logic is appropriate, i.e., if A and B are both "high."

FIG. 1c is a schematic of the exemplary circuit of FIG. 1a using a CMOS implementation. CMOS circuits can operate with a single phase clock. Unlike the implementation of FIG. 1a, transistor T1 is a PMOS transistor in this implementation. The gates of T1 and T2 both connect to the clock input $\phi_0$ to simultaneously charge the output node Vout and discharge Vout if the input logic is appropriate. Dynamic circuits are used in memory and microprocessor circuits. For example, dynamic circuits can be used in command decoders, command predecoders, and control circuits. Dynamic circuits have low power dissipation and synchronous operation.

A dynamic random access memory (DRAM) is a semiconductor device for storing digital information. Data, as digital information, can be written to and read from a DRAM. DRAMS can be fabricated using MOS integrated circuit technology.

FIG. 2 is a schematic of a DRAM memory cell 100. A DRAM has many memory cells. Typically, each memory cell comprises a combination of a transistor 101 and a capacitor C 103. In the storage cell, digital information is represented by a charge stored in the capacitor C 103. When the memory cell 100 stores a "1" value, the capacitor 103 is charged, and when the memory cell 100 stores a "0" value, the capacitor is discharged. However, the present invention is equally applicable when a charged capacitor is used to store a "0" value and a discharged capacitor is used to store a "1" value.

The capacitor C 103 will lose any charge stored by the capacitor unless it is regularly recharged or refreshed. Also, reading the information stored in the memory cell 100 destroys the contents of the memory cell 100. More specifically, after a memory cell 100 that previously had a charged capacitor has been read, the amount of charge remaining on the capacitor is not sufficient to distinguish it from a memory cell having a discharged capacitor. As a result, the information previously stored in the memory cell needs to be restored after it has been read. Also, the memory cell needs to be periodically refreshed to prevent the information stored by the memory cell from being lost due to charge leakage.

Each memory cell 100 is connected to a word-line (WL) 105 and a bit-line 107. A word-line driver restores the contents of the memory cell 100. To restore a "one" level to the memory cell capacitor C 103, the word line driver must output a voltage on the word line 105 that exceeds the voltage present on the bit-line 107. Since the maximum voltage that will be present on the bit line 107 after a read operation is the supply voltage Vcc, the word line driver must generate a voltage that exceeds Vcc. Typically, the word line driver is a charge pump circuit that generates a voltage that exceeds the supply voltage Vcc. The charge pump circuit typically includes an oscillator that generates a series of pulses.

As the bit density and number of memory cells in a DRAM increases, the complexity of the DRAM increases. DRAMs use dynamic circuits to reduce power consumption. In addition, DRAMs use pulse generators and oscillators to perform various functions such as charge pumping, and the outputs of the pulse generators are often combined to generate one or more additional pulses.

FIG. 3 is a schematic of a typical circuit 300 to combine two pulses. In this and the following schematics, the following additional conventions are used. The numbers beneath the reference character near the transistor indicate the transistor's preferred width and length. For example, n-channel transistor M2 has a width of 10 microns and a length of 0.5 microns.

In FIG. 3, pulses IN1 and IN2 are input to NAND gates 301 and 302 respectively. The other input of each NAND gate 301, 302 connects to Vcc causing the NAND gates 301, 302 to act like invertors. The outputs of NAND gates 301 and 302 are called node N1 and node N2 respectively. P-channel transistor M10 connects in series with n-channel transistors M2 and M4 to form a NAND gate. The source of M10 connects to Vcc and the source of M4 connects to ground. The outputs of NAND gates 301 and 302 are connected to the gate of n-channel transistors M2 and M4, respectively. In addition, the output of NAND gate 302 connects to the gate of p-channel transistor M10. The drain of M10 connects to the input of inverter I1 at node N4. The output of inverter I1 on node N5 is the output of the pulse generator. The source of p-channel transistor MS connects to Vcc, the drain of MS connects to node N4, and the gate of MS connects to node N5.

FIGS. 4a, 4b and 4c are timing diagrams of the prior art circuit 300 of FIG. 3. FIG. 4a is a timing diagram showing the output of the pulse generator 300, node N5, when input pulses IN1 and IN2 are in phase. When IN1 is high, node N1 is low. When node N1 is low, transistor M2 is not conducting current and the drain of M2 presents a high impedance. Similarly, when IN2 is high, node N2 is low. When node N2 is low, transistor M4 is not conducting current; however, transistor M10 does conduct current and node N4 goes high, to voltage level Vcc. When node N4 is high, the output of inverter I1, node N5, goes low. When node N5 is low p-channel transistor MS is "on" thereby pulling up the input to inverter I1 to Vcc.

When IN1 is low, node N1 is high. When node N1 is high, transistor M2 conducts current. When IN2 is low, node N2 is high. When node N2 is high, transistor M4 conducts current and transistor M10 is "off." When nodes N1 and N2 are both high, transistors M2 and M4 are both "on" and node N4 goes "low," i.e., to ground. When node N4 goes low, the output of inverter I1, i.e., node N5, goes high thereby turning off transistor M8s.

For slow DRAMs having a long cycle time, the circuit of FIG. 3 generates a pulse of sufficient duration. However, in large, fast DRAMS, signal path lengths are often unequal, signal loads are often not exactly matched, both of which cause signals that should have identical timing to be skewed with respect to each other. As a result, the circuit of FIG. 3 sometimes has a problem if used in high density, fast DRAMS to generate a pulse from the combination of two input pulses.

FIG. 4b shows the output pulse at node N5 when input pulses IN1 and IN2 are skewed or out-of-phase with respect to each other. FIG. 4c shows the output pulse at node N5 when input pulses IN1 and IN2 are skewed to the point where IN1 and IN2 are almost 180° out of phase. As the skew between IN1 and IN2 increases, the width of the pulse output at node N5 decreases. The narrow width of the output pulse at node N5 causes problems. In FIG. 4c, the output pulse at node N5 has pulse width of about two nanoseconds (ns) and is not sufficient to precharge a dynamic circuit or to provide a sufficient duration input pulse to a charge pump, a latch or register. As a result, the dynamic circuit can enter a meta-stable state and malfunction.

Therefore, a method and apparatus are needed to guarantee a sufficiently long pulse width when combining input pulses.

SUMMARY OF THE INVENTION

The present invention is dynamic pulse generator for generating an output pulse from a first input pulse and a second input pulse, where the output pulse is guaranteed to have a pulse width of at least the pulse width of whichever of the two input pulses has a delayed leading edge with respect to the other. The first input pulse has a first leading edge and a first trailing edge. The second input pulse has a second leading edge and a second trailing edge. The second leading edge is delayed from the first leading edge. An edge detector detects the second leading edge, and outputs a first predetermined level when the second leading edge is detected. The edge detector also detects the first trailing edge and the second trailing edge and outputs a second predetermined level. A latch is responsive to the edge detector and generates a signal indicating that the second leading edge has been detected. The latch maintains the output of the edge detector at the first predetermined level until the edge detector detects both the first trailing edge and the second trailing edge.

The present invention is also for a DRAM comprising the guaranteed dynamic pulse generator. The DRAM has a plurality of memory cells and control circuitry. The control circuitry is coupled to the plurality of memory cells and has a first circuit for generating a first pulse having a first leading edge and a first trailing edge. The control circuitry also has a second circuit for generating a second pulse having a second leading edge, a second trailing edge and a second pulse width. The second leading edge being delayed from the first leading edge.

A detector detects the second leading edge. A means, responsive to the detector, outputs an output pulse having a first and a second state. The output pulse has a pulse width at least substantially equal to the second pulse width and is output after the detector detects the second leading edge. The means comprises a latch to lock the output pulse to the first state when the detector detects the second leading edge.

The present invention also provides a method for generating a guaranteed dynamic pulse from a first pulse and a second pulse. The first pulse has a first leading edge and a first trailing edge. The second pulse has a second leading edge, a second trailing edge and a second pulse width. The second leading edge is delayed from the first leading edge. The method detects the second leading edge, latches a first latch state indicating that the second leading edge was detected, outputs a first output state after the second leading edge was detected, detects the first trailing edge and the second trailing edge, latches a second latch state indicating that the first trailing edge and the second trailing edge were detected, and outputs a second output state after detecting the first trailing edge and the second trailing edge.

BRIEF DESCRIPTION OF THE DRAWINGS

FIG. 1a is a schematic diagram of an exemplary NMOS dynamic circuit.

FIG. 1b is a timing diagram of the clock pulses input to the exemplary circuit of FIG. 1a.

FIG. 1c is a schematic diagram of the exemplary circuit of FIG. 1a implemented in CMOS technology.

DESCRIPTION OF THE PREFERRED EMBODIMENTS

Figure 5:
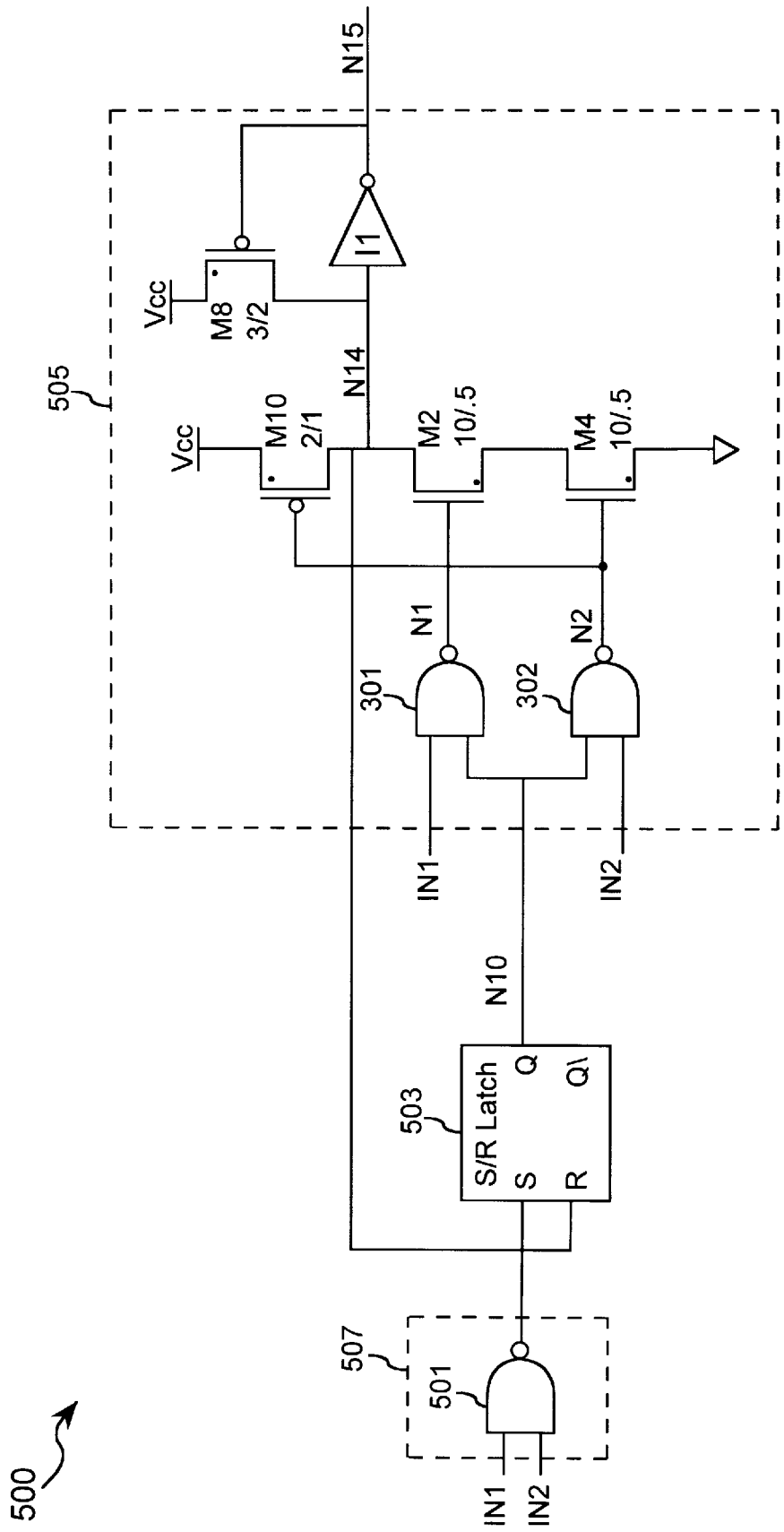
FIG. 5 is a schematic diagram of a guaranteed dynamic pulse generator of the present invention.

FIG. 5 is a schematic diagram of a guaranteed dynamic pulse generator 500 of the present invention. The guaranteed dynamic pulse generator 500 uses a latch 503 to recognize the difference in phase between input pulses IN1 and IN2 and waits for the output at node N14 to respond to the slower of the input signals. The guaranteed dynamic pulse generator 500 provides a pulse having substantially at least the width of the delayed pulse when the leading edge of the delayed pulse occurs during an active time window of the earlier pulse. The active time window extends from the leading edge of the earlier pulse to the trailing edge of the earlier pulse.

The guaranteed dynamic pulse generator 500 comprises a latch 503 and an edge detector. The edge detector comprises a leading edge detector 505 and a trailing edge detector 507. Node N15 is the output of the guaranteed pulse generator 500. The leading edge detector 505 is coupled to the latch 503 to reset the latch 503 when the leading edge of the delayed pulse is detected. In addition, the leading edge detector 505 outputs a first signal level (i.e., a high voltage that is at or close to Vcc) on node N15 as the output from the guaranteed pulse generator. The trailing edge detector 507 sets the latch 503 when the trailing edges of both input pulses are detected, which causes the guaranteed pulse generator to output a second signal level (i.e., a low voltage) on node N15.

The leading edge detector 505 comprises NAND gates 301 and 302, n-channel transistors M2 and M4, p-channel transistors M8 and M10, and inverter 11. The latch 503 is an SR latch which is set and reset using negative logic signals. That is, a "low" signal at the S input of the latch 503 causes its Q output to transition to a "high" voltage, and a "low" signal at the R input of the latch 503 causes its Q output to transition to a "low" voltage.

The trailing edge detector 507 comprises a NAND gate 501.

Figure 6:
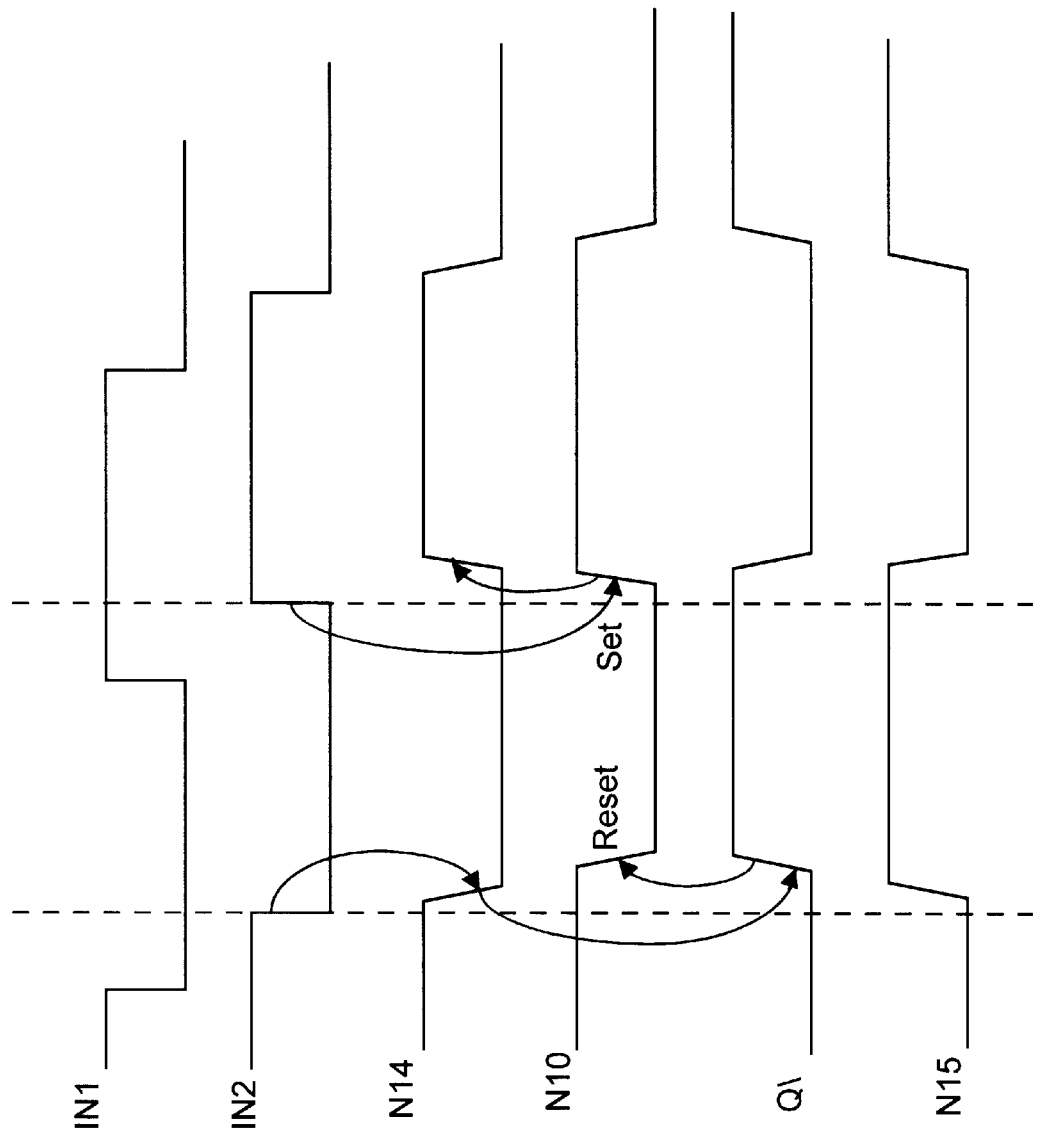
FIG. 6 is a timing diagram of the guaranteed dynamic pulse generator of FIG. 5.

FIG. 6 is a timing diagram of the guaranteed dynamic pulse generator 500 of FIG. 5. The timing diagram shows input pulses IN1 and IN2. IN2 is delayed with respect to IN1. The leading edge of IN2 occurs after the leading edge of IN1 and within the window of time when IN1 is low. The trailing edge of IN2 occurs after the trailing edge of IN1. The Q output of the latch 503 is node N10. Initially, the latch 503 is set and node N10 is at a "high" level. Node N10 remains high until node N14 goes low to reset the latch 503. More specifically, when both IN1 and IN2 go low, both transistors M2 and M4 turn on and node N14 goes low to reset the latch 503, which causes the latch's Q output on node N10 to go low and the inverted Q output to go high. As long as node N10 is low, the output of NAND gates 301 and 302 remains high, thereby turning on transistors M2 and M4 and keeping node N14 at a low state. When node N14 goes low, the guaranteed dynamic pulse generator 500 outputs a high at node N15.

When IN1 transitions to a high state, the latch 503 output Q on node N10 remains low and node N14 remains high because the low Q output of the latch 503, which locks node N14 at a high voltage and output node N15 at a low voltage.

When both IN1 and IN2 transition to a high voltage the output of NAND gate 501 goes low, which causes the latch 503 output Q on node N10 to become high. Since all inputs, Q, IN1 and IN2, to NAND gates 301 and 302 are high, the NAND gates output low voltage signals that turn off transistors M2 and M4 and cause node N14 to switch to a high voltage and output node N15 to a low voltage. Therefore, the guaranteed pulse generator 500 outputs a pulse having at least substantially the width of the delayed input pulse IN2.

It should be noted that the pulse generator circuit 500 operates equally well regardless of the order in which the two input signals are received, so long as the two signals overlap long enough to trigger the leading edge detector 505.

In an alternative embodiment, the leading edge detector comprises a single NAND gate with inputs IN1, IN2 and the Q output of the latch 503. The output of the NAND gate is node NI5.

Figure 7:
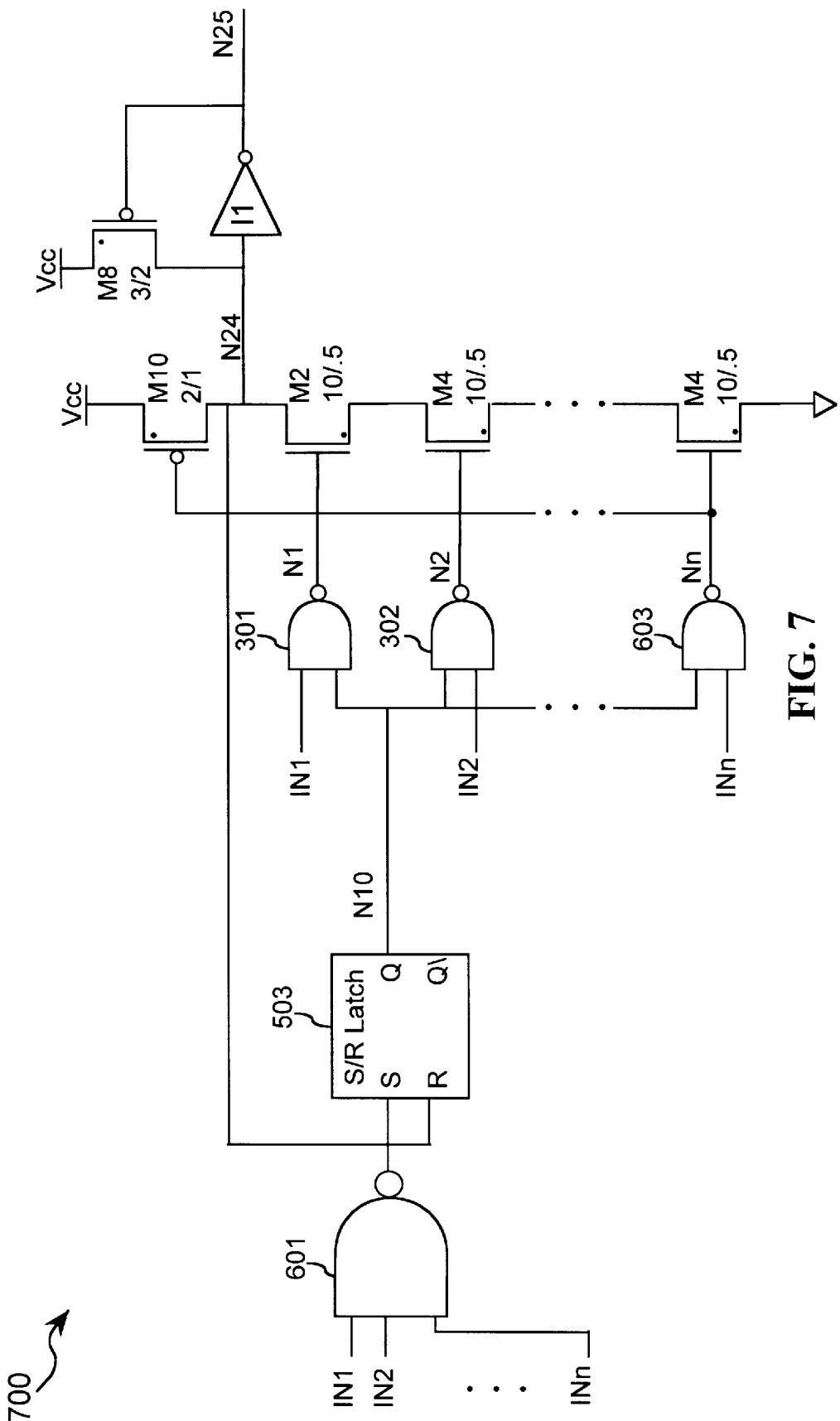
FIG. 7 is a schematic diagram of a general version of the guaranteed dynamic pulse generator of the present invention.

FIG. 7 is a schematic diagram of a general version of a guaranteed pulse generator of the present invention. The guaranteed pulse generator 700 of FIG. 7 has n inputs IN1 to INn and provides an output pulse whose width or duration is determined by the width of the most delayed input pulse that occurs within the pulse width or window of the earliest pulse.

Figure 4A:
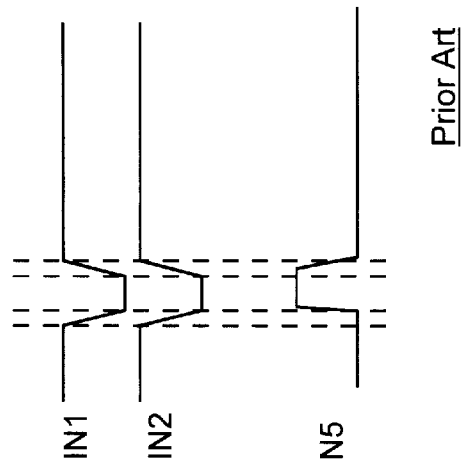
FIG. 4a is a timing diagram showing the output of the pulse generator of FIG. 2 when the input pulses IN1 and IN2 are aligned.
Figure 4B:
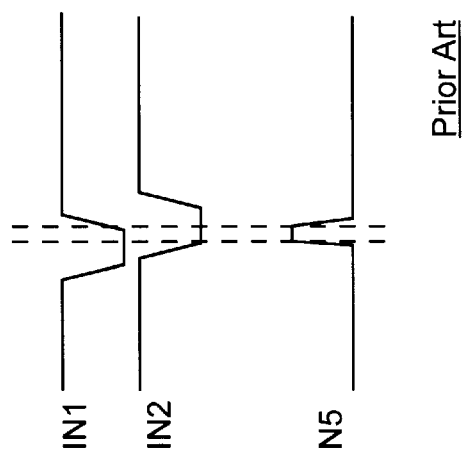
FIG. 4b is a timing diagram showing the output of the pulse generator of FIG. 2 when the input pulses IN1 and IN2 are skewed.
Figure 4C:
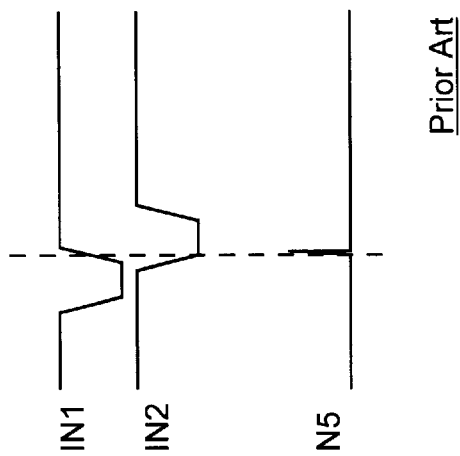
FIG. 4c is a timing diagram showing the output of the pulse generator of FIG. 2 when the input pulses IN1 and IN2 are about 180° out of phase.
Figure 8C:
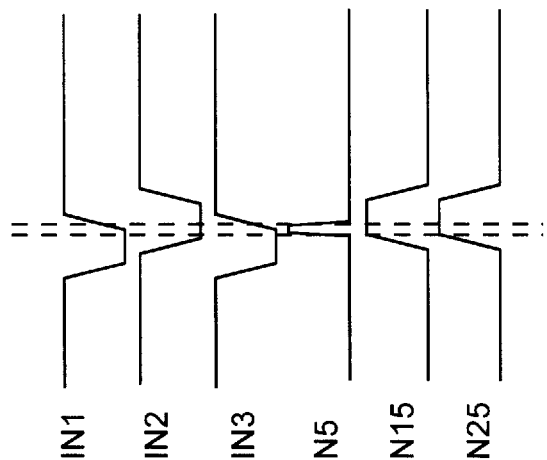
FIG. 8c is a timing diagram comparing the output of the pulse generators of FIGS. 3, 5 and 7 when the input pulses IN1 and IN2 are about 180° out of phase.
Figure 8B:
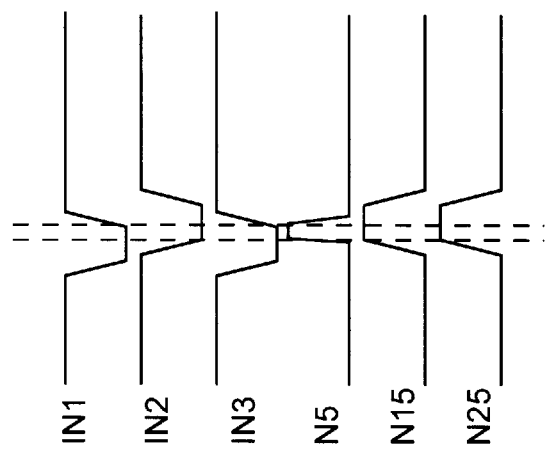
FIG. 8b is a timing diagram comparing the output of the pulse generators of FIGS. 3, 5 and 7 when the input pulses IN1 and IN2 are skewed.
Figure 8A:
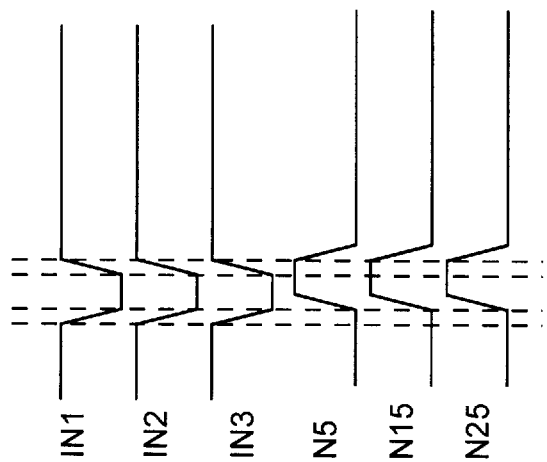
FIG. 8a is a timing diagram comparing the output of the pulse generators of FIGS. 3, 5 and 7 when the input pulses IN1 and IN2 are aligned.

FIGS. 8a, 8b and 8c are timing diagrams comparing the output of the pulse generators of FIG. 4, FIG. 5 and FIG. 7. Node N5 is the output of the prior art circuit of FIG. 4. Node N15 is the output of the guaranteed pulse generator of FIG. 5. Node N25 is the output of the generalized pulse generator of FIG. 7.

Figure 2:
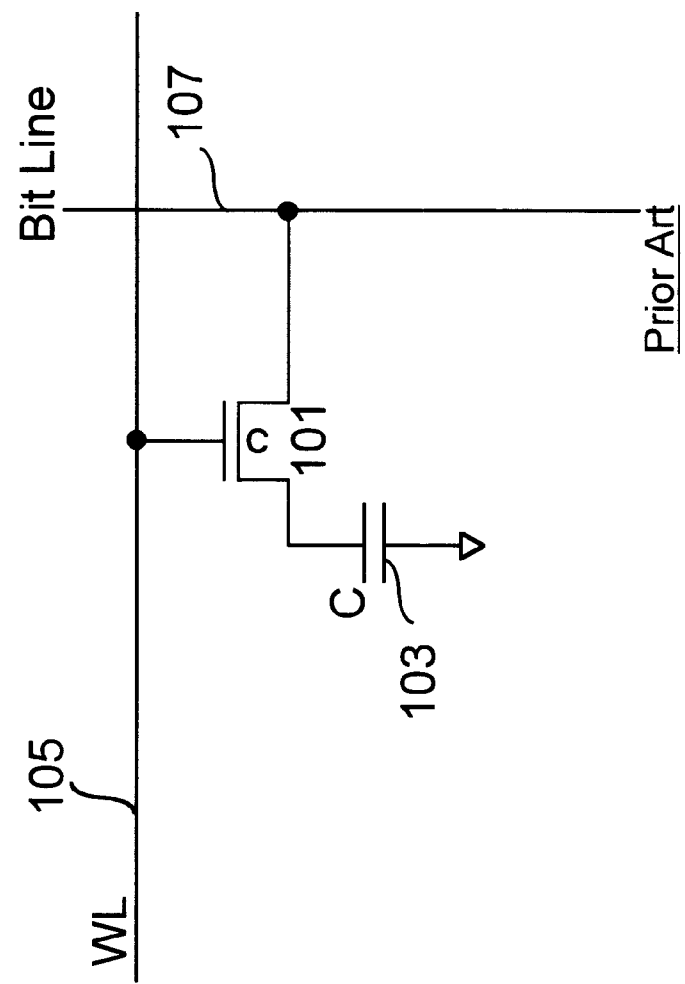
FIG. 2 is a schematic diagram of a memory cell.
Figure 3:
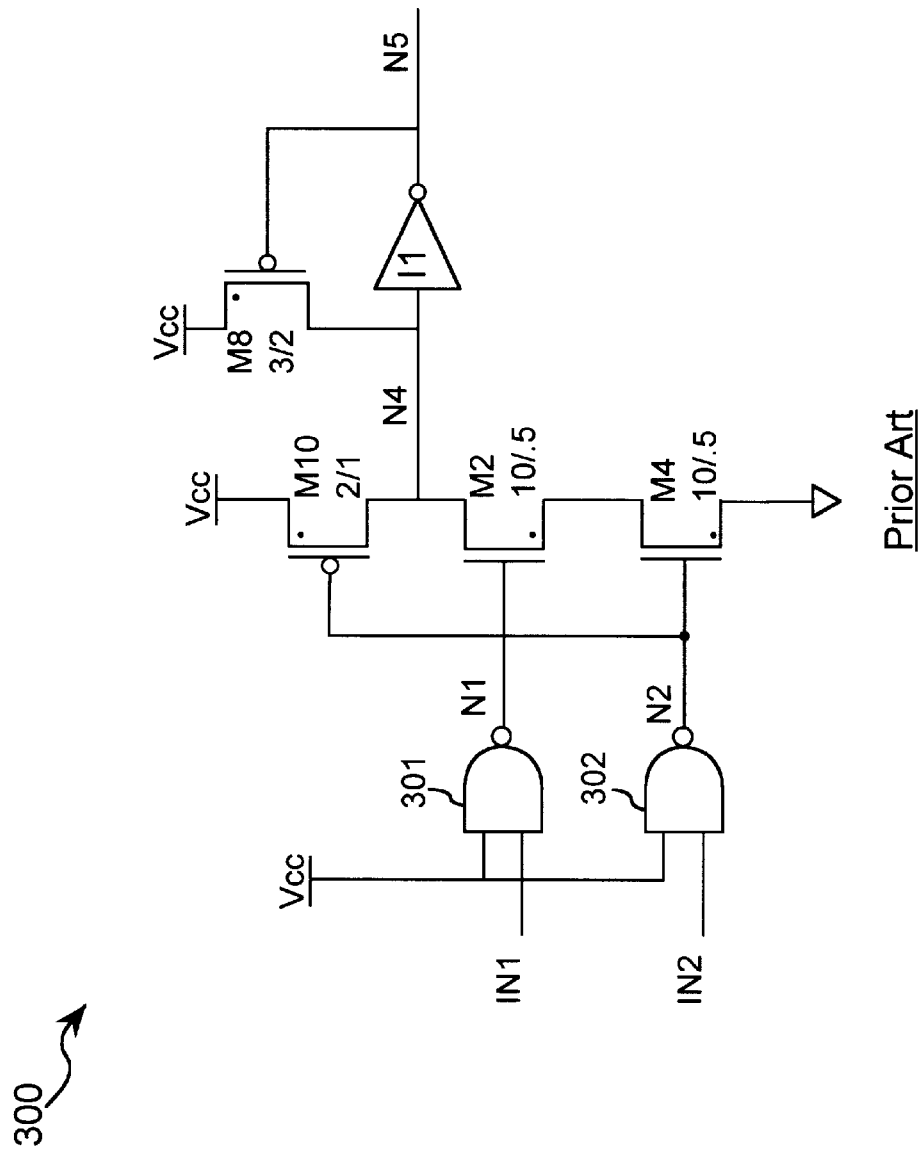
FIG. 3 is a schematic diagram of a pulse generator of the prior art.

FIG. 8a is a timing diagram comparing the outputs of the pulse generators of FIG. 3, FIG. 5 and FIG. 7 when the input pulses IN1 and IN2 are aligned. IN1 is held constant and IN2 is shifted or skewed with respect to IN1. IN3 applies to the circuit of FIG. 7 when N is equal to three. In the present example, IN3 is not shifted with respect to IN1.

FIG. 8b is a timing diagram showing the outputs of the pulse generators of FIG. 3, FIG. 5 and FIG. 7 when the input pulses IN1 and IN2 are skewed. The prior art circuit's output N5 has a narrower pulse width than the guaranteed dynamic pulse generator's outputs N15 and N25. Unlike the prior art circuit of FIG. 3, the guaranteed dynamic pulse generator generates an output pulse having a width or duration substantially equal to that of the delayed pulse IN2. The output pulses N15 and N25 are not generated until the delayed pulse IN2 changes state and continue to be generated until the delayed pulse IN2 once again changes state, even though the input pulse IN1 already went high.

FIG. 8c is a timing diagram showing the outputs of the pulse generators of FIG. 3, FIG. 5 and FIG. 7 when the input pulses IN1 and IN2 are about 180° out of phase. Unlike the prior art circuit of FIG. 3, the guaranteed dynamic pulse generator again generates an output pulse having a width or duration substantially equal to that of the delayed pulse IN2. The output pulses N15 and N25 are not generated until the delayed pulse IN2 changes state and continue to be generated until the delayed pulse IN2 once again changes state, even though the input pulse IN1 already went high. If the trailing edge of IN1 followed the trailing edge of IN2, the output pulse N15, N25 would remain high until the trailing edge of IN1 occurred.

Figure 9A:
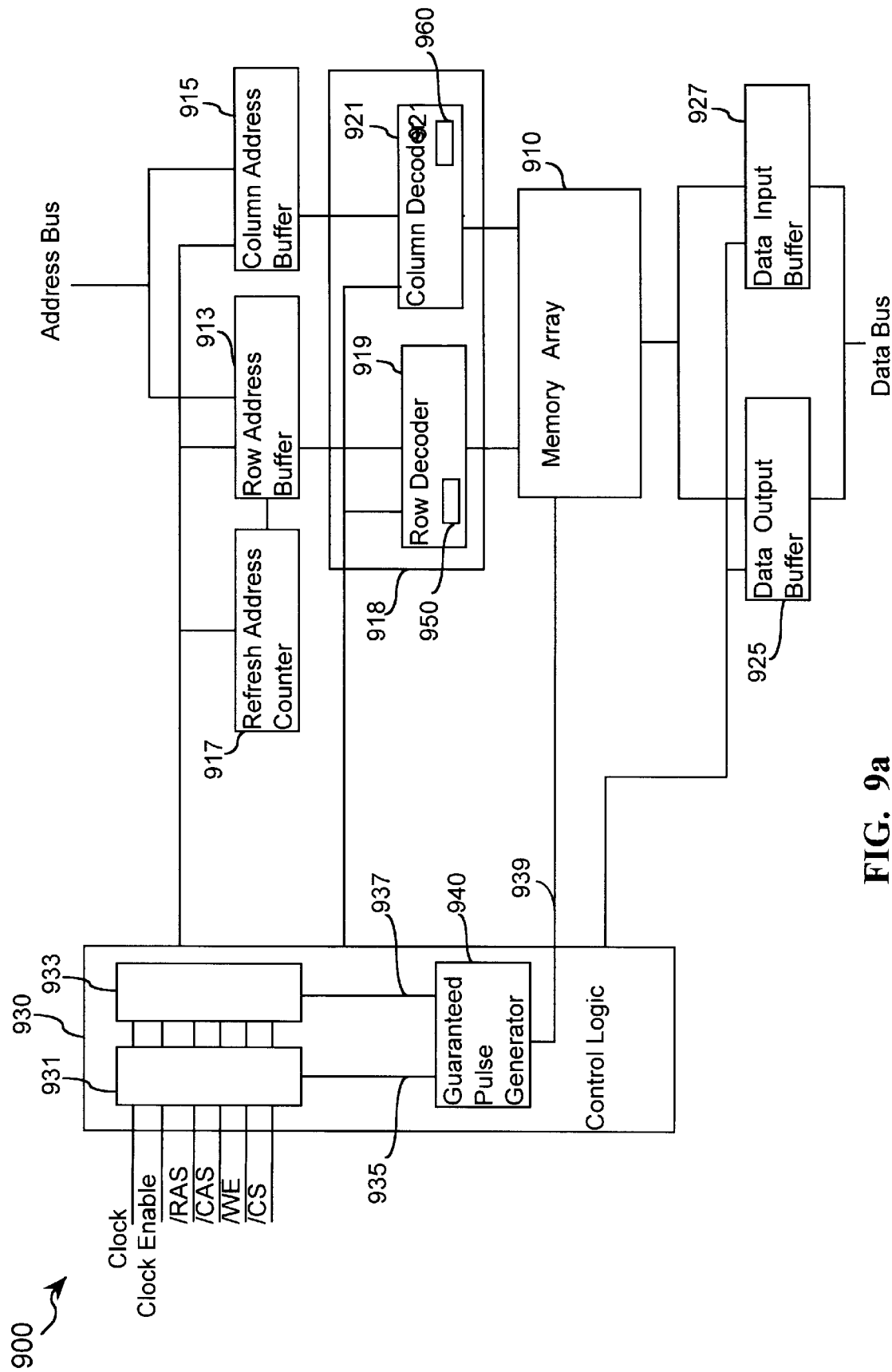
FIG. 9a is a block diagram of a DRAM using the dynamic pulse generator of FIG. 5.

FIG. 9a is a block diagram of a DRAM 900 using the guaranteed dynamic pulse generator of FIG. 5. The DRAM 900 connects to an address bus, data bus and external control signals. The DRAM 900 comprises many well-known parts.

A memory array 910 has a plurality of memory cells organized into rows and columns. A row is selectable by the word line and a column is selectable by the bit line.

A row address buffer 913 stores a row address supplied on the address bus.

A column address buffer 915 stores a column address supplied on the address bus.

A refresh address counter 917 provides the current address to refresh.

A decoder 918 comprises a row decoder 919 and a column decoder 921. The row decoder 919 connects to the row address buffer 913 and memory array 910, and comprises logic to translate the row address supplied to the row address buffer 913 to select the desired row or word line of the memory array 910. The column decoder 921 connects to the column address buffer 915 and memory array 910, and comprises logic to translate the column address supplied to the column address buffer 915 to select the desired column or bit line(s) of the memory array 910.

A data output buffer 925 stores information read from the memory array 910 for output to the data bus.

A data input buffer 927 stores information received from the data bus for input to the memory array 910.

Control Logic 930 connects to the external control signals, including the clock, and to the elements listed above to control the operation of the DRAM. A "/" in front of the signal name indicates that the signal is active with negative logic. Typical external control signals are shown: a clock input, a Clock Enable input, a row address select (/RAS) input, a column address select (/CAS) input, a write enable (/WE) input and a chip select (/CS) signal.

The guaranteed dynamic pulse generator 940 is used within the control logic 930 to guarantee that sufficiently long pulses are provided. The DRAM control logic 930 derives numerous pulses or control signals for internal control from combinations of the external control signals and timing can be skewed. The guaranteed dynamic pulse generator 940 can be used to combine the desired derived control signals to guarantee a sufficiently long pulse. For example, the control signals, including the clock, are input to logic blocks 931 and 933. The logic blocks 931 and 933 output first and second derived control signals 935 and 937 respectively, which are input to the guaranteed dynamic pulse generator 940. The output 939 of the guaranteed dynamic pulse generator connects to the memory array 910. In another example, the decoders 919 and 921 can use the guaranteed dynamic pulse generators 950 and 960, respectively, to combine derived internal control signals to provide a sufficiently long pulse for the word and bit lines used to access the memory array 910.

Although FIG. 9a shows an exemplary DRAM, the guaranteed dynamic pulse generator can also be used in static RAMs. The block diagram and external signals for a static RAM are similar that shown in FIG. 9a for a DRAM and will not be shown. Typically, unlike a DRAM, a static RAM does not have an external clock input. Therefore, except for the external clock signals, the block diagram of FIG. 9a also applies to static RAMs. Like in the DRAM, the guaranteed dynamic pulse generator can be used in the control logic and decoders of the static RAM.

Figure 9B:
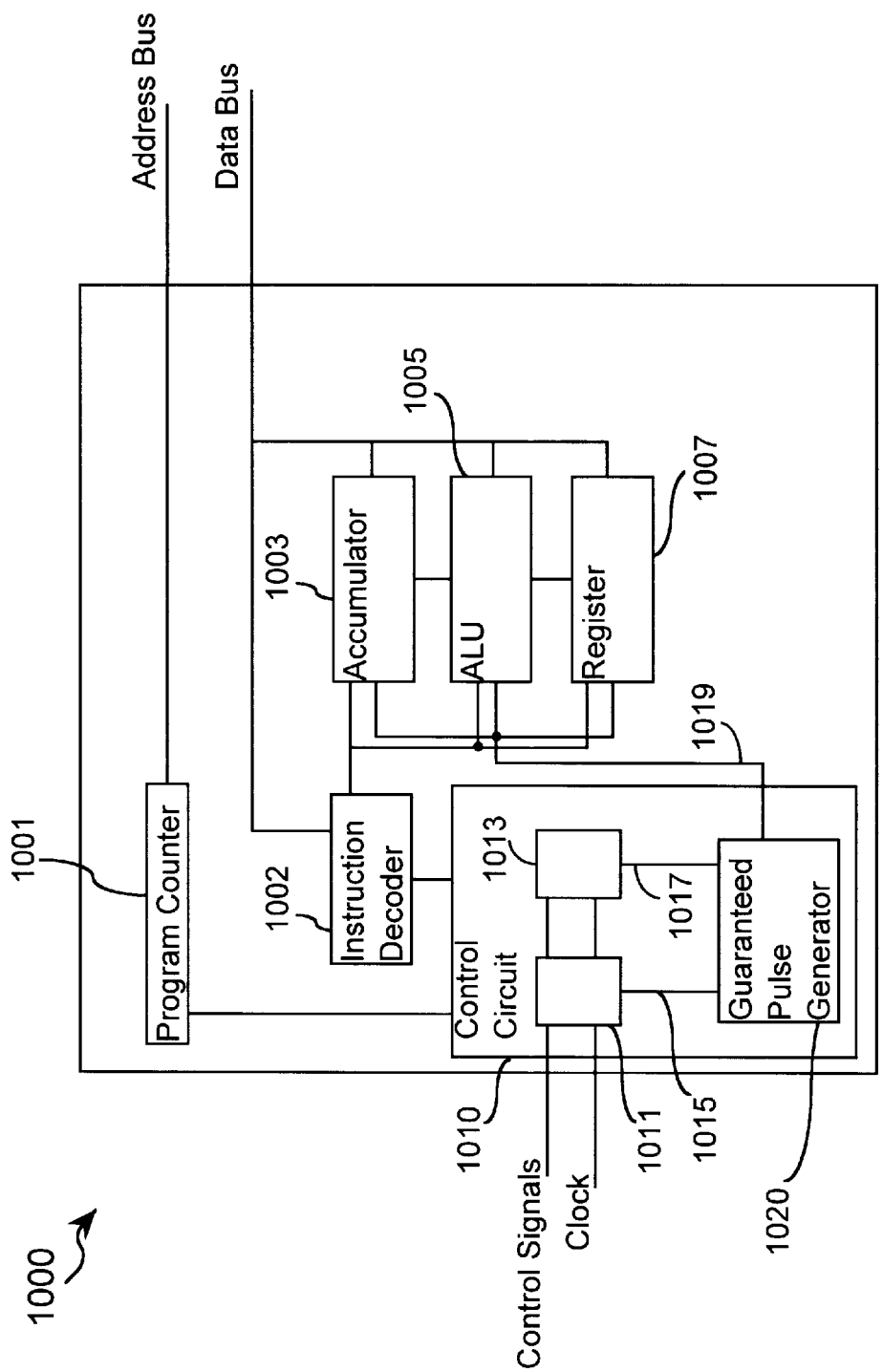
FIG. 9b is a block diagram of a microprocessor using the dynamic pulse generator of FIG. 5.

FIG. 9b is a block diagram of a microprocessor 1000 using the guaranteed dynamic pulse generator of FIG. 5. The microprocessor 1000 has an external address bus, an external data bus (Data In and Data Out), inputs for external control signals and an input for an external clock. The microprocessor 1000 comprises many well-known parts.

A program counter 1001 generates memory addresses to supply the next instruction to execute.

An instruction decoder 1002 decodes the instruction supplied to the microprocessor 1000 on the data bus.

An accumulator 1003, arithmetic logic unit (ALU) 1005 and register 1007 are responsive to the instruction decoder 1002 and can operate together to perform a desired operation.

A control circuit 1010 receives the external control signals, including the external clock, and connects to the various elements of the microprocessor 1000 to generate control signals to perform the operation decoded by the instruction decoder 1002.

The microprocessor 1000 control circuit 1010 derives numerous pulses or control signals for internal control from combinations of the external control signals and clock. As a result, timing of the derived control signals can be skewed. The control logic 1010 comprises a guaranteed dynamic pulse generator 1020 that can be used to combine the desired derived internal control signals to guarantee a sufficiently long pulse. For example, the control signals and clock are input to logic blocks 1011 and 1013. The logic blocks 1011 and 1013 output first and second derived control signals 1015 and 1017 respectively, which are input to the guaranteed dynamic pulse generator 1020. The output 1019 of the guaranteed dynamic pulse generator connects to the accumulator 1003, ALU 1005 and register 1007.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A guaranteed dynamic pulse generator for generating an output pulse from a first input pulse and a second input pulse, the first input pulse having a first leading edge and a first trailing edge, the second input pulse having a second leading edge and a second trailing edge, the second leading edge being delayed from the first leading edge, comprising:

an edge detector for detecting the second leading edge, and for outputting a first predetermined level when the second leading edge is detected, the edge detector also for detecting the first trailing edge and the second trailing edge and outputting a second predetermined level; and a latch, responsive to the edge detector, for generating a signal indicating that the second leading edge has been detected, and for maintaining the output of the edge detector at the first predetermined level until the edge detector detects both the first trailing edge and the second trailing edge.

2. The guaranteed dynamic pulse generator of claim 1 wherein the latch comprises an SR latch.

3. The guaranteed dynamic pulse generator of claim 1 wherein the edge detector comprises a leading edge detector for detecting the second leading edge, and a trailing edge detector for detecting the first trailing edge and the second trailing edge.

4. The guaranteed dynamic pulse generator of claim 1 wherein the edge detector detects the second leading edge after detecting the first leading edge.

5. A guaranteed dynamic pulse generator for generating an output pulse from a first input pulse and a second input pulse, the first input pulse having a first leading edge and a first trailing edge, the second input pulse having a second leading edge and a second trailing edge, the second leading edge being delayed from the first leading edge, comprising:

a latch capable of outputting a reset state and a set state in response to a reset signal and a set signal respectively;

a leading edge detector, responsive to the latch, capable of detecting the second leading edge and outputting a set signal to the latch, the leading edge detector also outputting a first predetermined level when the second leading edge is detected; and a trailing edge detector capable of detecting the first trailing edge and second trailing edge and outputting a set signal to the latch, wherein the latch is responsive to the trailing edge detector and outputs the set state, wherein the latch causes the leading edge detector to output the first predetermined level until the latch outputs the set state.

6. The guaranteed dynamic pulse generator of claim 5 wherein the trailing edge detector comprises a NAND gate.

7. The guaranteed dynamic pulse generator of claim 5 wherein the latch is an SR latch.

8. The guaranteed dynamic pulse generator of claim 5 wherein the leading edge detector comprises a NAND gate.

9. A method for generating a guaranteed dynamic pulse from a first pulse having a first leading edge and a first trailing edge, a second pulse having a second leading edge, a second trailing edge and a second pulse width, the second leading edge being delayed from the first leading edge, the method comprising the steps of:

detecting the second leading edge;

latching in a latch a first latch state indicating that the second leading edge has been detected;

outputting a first signal having a first predetermined level after detecting the second leading edge;

detecting both the first trailing edge and the second trailing edge;

latching in the latch a second latch state indicating that both the first trailing edge and the second trailing edge have been detected;

outputting a second signal having a second predetermined level after detecting both the first trailing edge and the second trailing edge.

10. The method of claim 9, including detecting second leading edge after detecting the first leading edge.

11. A random access memory (RAM) comprising:

a plurality of memory cells;

a decoder coupled to the plurality of memory cells for receiving an address representing a desired subset of memory cells of the plurality of memory cells;

a control circuit coupled to the decoder and the plurality of memory cells for receiving a plurality of external control signals, and for deriving a plurality of internal control signals from the external control signals, the plurality of internal control signals having a first derived control signal and a second derived control signal, the first derived control signal having a first leading edge and a first trailing edge, the second derived control signal having a second leading edge, a second trailing edge and a second pulse width, the second leading edge being delayed from the first leading edge, the control circuit further comprising:

an edge detector for detecting the second leading edge, and for outputting a first predetermined level when the second leading edge is detected, the edge detector also for detecting the first trailing edge and the second trailing edge and outputting a second predetermined level; and a latch, responsive to the edge detector, for generating a signal indicating that the second leading edge has been detected, and for maintaining the output of the edge detector at the first predetermined level until the edge detector detects both the first trailing edge and the second trailing edge.

12. The RAM of claim 11 wherein the edge detector detects both the first leading edge and the second leading edge and outputs the first predetermine level after both the first leading edge and the second leading edge are detected.

13. The RAM of claim 11 wherein the edge detector comprises a leading edge detector capable of detecting the second leading edge and a trailing edge detector capable of detecting the first trailing edge and the second trailing edge.

14. A microprocessor comprising:

a program counter for generating an address;

an instruction decoder coupled to the program counter, for decoding an instruction received from a data bus;

an accumulator coupled to an arithmetic logic unit coupled to a register;

a control circuit coupled to the program counter, instruction decoder, accumulator, arithmetic logic unit and register, the control circuit receiving external control signals and an external clock and deriving a plurality of internal control signals from the external control signals, the plurality of internal control signals having a first derived control signal and a second derived control signal, the first derived control signal having a first leading edge and a first trailing edge, the second derived control signal having a second leading edge, a second trailing edge and a second pulse width, the second leading edge being delayed from the first leading edge, the control circuit further comprising:

an edge detector for detecting the second leading edge, and for outputting a first predetermined level when the second leading edge is detected, the edge detector also for detecting the first trailing edge and the second trailing edge and outputting a second predetermined level; and a latch, responsive to the edge detector, for generating a signal indicating that the second leading edge has been detected, and for maintaining the output of the edge detector at the first predetermined level until the edge detector detects both the first trailing edge and the second trailing edge.

15. The microprocessor of claim 14 wherein the edge detector detects both the first leading edge and the second leading edge, and the means outputs an output pulse after both the first leading edge and the second leading edge are detected.

16. The microprocessor of claim 14 wherein the edge detector comprises a leading edge detector capable of detecting the second leading edge and a trailing edge detector capable of detecting the first trailing edge and the second trailing edge.

* * * * *